United States Patent
Kakishita et al.

(10) Patent No.: US 6,387,594 B1
(45) Date of Patent: May 14, 2002

(54) PLATE MAKING FILM, PLATE MAKING INK, PLATE MAKING METHOD USING THE FILM, AND PLATE MAKING SYSTEM USING THE FILM

(75) Inventors: Osamu Kakishita; Jun Nishioka; Shigeki Nishimura, all of Shiga; Kazuo Kuzukawa, Kyoto, all of (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 09/321,913

(22) Filed: May 28, 1999

Related U.S. Application Data (63) Continuation of application No. PCT/JP97/04368, filed on Nov. 28, 1997.

(30) Foreign Application Priority Data

Nov. 29, 1996 (JP) .............................. 8-319351
Jul. 15, 1997 (JP) .............................. 9-189737

(51) Int. Cl.$^7$ ............................ G03C 7/00; G03C 7/20; G03C 7/30; G03C 9/00; G03F 9/00
(52) U.S. Cl. ........................... 430/300; 430/5; 430/302; 430/306; 430/308; 430/325; 430/331
(58) Field of Search ................................ 430/302, 300, 430/306, 308, 325, 331, 5

(56) References Cited

U.S. PATENT DOCUMENTS

| | | | |
|---|---|---|---|
| 4,881,977 A | 11/1989 | Bauer et al. | 106/22 |
| 4,911,977 A | 3/1990 | Mouri et al. | 428/220 |
| 4,962,190 A | 10/1990 | Mayer et al. | 534/573 |
| 5,304,458 A * | 4/1994 | Berrier et al. | 430/281.1 |
| 5,372,907 A | 12/1994 | Haley et al. | 430/302 |
| 5,677,067 A | 10/1997 | Kojima et al. | 428/478.2 |
| 5,888,697 A * | 3/1999 | Fan | 430/273.1 |

FOREIGN PATENT DOCUMENTS

| | | |
|---|---|---|
| DE | 28 17 203 A1 * | 10/1979 |
| EP | 581038 | 2/1994 |

(List continued on next page.)

OTHER PUBLICATIONS

Fikentsche et al. DERWENT Abstract 1979–809558—English abstract for DE 2817203 A1 published on Oct. 31, 1979.*

Primary Examiner—Janet Baxter
Assistant Examiner—Sin J. Lee
(74) Attorney, Agent, or Firm—Fitch, Even, Tabin & Flannery (57) ABSTRACT

A plate making film has a layer provided on a transparent substrate, the layer consisting essentially of a polymeric compound composed of a repeating unit represented by the following general formula (1):

$$-\!\!\!-\!\!\![AXAR_1]\!-\!\!\!-\!\!\! \qquad (1)$$

where A is

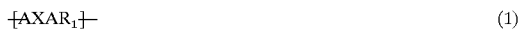

x, y and z each denote an integer of 1 or more, X is a residue of an organic compound having 2 active hydrogen groups, Y is a hydrocarbon group having 1 or more carbon atoms, and $R_1$ is a dicarboxylic acid compound residue, or a diisocyanate compound residue. On the plate making film, an image is formed, preferably, by ink jets using, preferably, a plate making ink containing a mono- or disazo dye which is a yellow dye highly ultraviolet absorbing properties for a wavelength of 350 to 450 nm. An inexpensive, high resolution, high grade photomask for plate making is produced thereby.

4 Claims, 6 Drawing Sheets

FOREIGN PATENT DOCUMENTS

| | | |
|---|---|---|
| JP | 60-248387 | 12/1985 |
| JP | 1-135874 | 5/1989 |
| JP | 1-126169 | 10/1989 |
| JP | 5-107730 | 4/1993 |
| JP | 06047924 | 2/1994 |
| JP | 8-44044 | 2/1996 |
| JP | 8-503903 | 4/1996 |
| WO | WO 94/20303 * | 9/1994 |

* cited by examiner

PLATE MAKING FILM, PLATE MAKING INK, PLATE MAKING METHOD USING THE FILM, AND PLATE MAKING SYSTEM USING THE FILM

This application is based on Japanese Patent Application No. 8-319351 (1996) filed Nov. 29, 1996 and Japanese Patent Application No. 9-189737 (1997) filed Jul. 15, 1997, the contents of which are incorporated hereinto by reference. In addition, this application is a continuation application of International Application No. PCT/JP97/04368 filed Nov. 28, 1997 designating the U.S.

BACKGROUND OF THE INVENTION

1. Field of the Invention

This invention relates to a plate making film and a plate making ink for the production of a printing plate used for printing such as offset printing, flexography or screen printing, and a plate making method and a plate making system using the plate making film and/or the plate making ink.

2. Description of the Related Art

Offset printing using a presensitized plate, flexography using a resinous letterpress, or screen printing using a photosensitive resin has employed a lith film containing a silver salt as a photosensitive material. Any of these printing methods rely on the following principle: A silver salt-containing film is set on the surface of a photosensitive layer of a plate material. Then, the photosensitive layer is irradiated with visible light or ultraviolet radiation through the film to solubilize or insolubilize the light- or ultraviolet-irradiated photosensitive portion by a photochemical reaction or the like. Then, the photosensitive layer is subjected to development to remove the soluble portion and form image areas corresponding to an image on the plate material.

The use of the lith film requires waste liquor disposal for the developing solution. Furthermore, equipment(s) for a development-printing-fixing system, and the lith film itself are very expensive. Thus, there has been a demand for development of an alternative to the lith film.

In recent years, electronic technologies have advanced remarkably. High performance models of computers have become available, and have been utilized in various fields. Output imaging machines for computers and recorders have also markedly advanced in technological improvement. Their spread to. the CAD field utilizing their high definition printout performance is promising, and may take the place of the lith film in the field of print making.

Image-forming or drawing machines are classified by their image forming principle into those based on several methods, such as the thermal printing method, the electrophotographic method, and the ink jet method. Alternatives to the lith film include, for example, a transparent film comprising a polyester film (e.g., PET) as a substrate, whose surface has been subjected to special treatment exclusive for each of the image forming methods. Any of these alternative films is used for plate making, and is thus required to have high dimensional stability of the base film as well as high resolution. This is a major factor for selection of the drawing method.

According to the thermal printing method and the electrophotographic method, heat of a head is continuously applied to the film, when an image is formed on the film. Thus, particularly when performing solid printing, the film stretches or deforms, thereby failing to obtain such accuracy as required of uses for plate making.

The ink jet method poses no such problems. However, this method involves a problem resulting from the properties of ink used, i.e., the problem that a hydrophilic membrane is indispensable for a surface to which ink is applied to draw an image, while a plastic film used as the transparent film is usually hydrophobic. A film having a hydrophilic membrane is disclosed in Japanese Patent Application Laying-open No. 6-47924 (1994), but this film is still problematical in terms of resolution. Moreover, the film used with the ink jet method is required to comprise a recording sheet excellent in ink wettability and absorbency, and free from stain due to escape of ink, bleeding of printed areas under high humidity, and stickiness of the printed surface.

To avoid the burden of using a plate making film for performing plate making, a proposal has been made for a direct plate making method which directly forms an image on a plate material by an image drawing device.

Among direct plate making systems known thus far is a laser plate making system. With this system, the surface of a plate material, such as a presensitized plate or an electrophotographic plate, is scanned with a beam of a laser which is turned on or off based on digital image information. A chemical or physical change of the portion irradiated with the laser beam forms image areas, corresponding to the image information, on the plate material. Such a laser plate making system, however, requires a laser device for generating a laser beam, and a complicated combination of an optical system, a drive system, and a scanning system for modulating a single laser beam, which is produced by the laser device, on the basis of image information, and guiding this beam to the surface of the plate material. Thus, a large-scale, expensive apparatus or system is used. Furthermore, the laser plate making system can produce various plates, but poses the problem that when a plate material including a silver salt as a photosensitive substance is used, the cost of the plate material is high, although high sensitivity and high resolution are obtained. When the laser plate making system is applied to an electrophotographic system which forms a toner image on a photosensitive member, the process involved is complicated, and the resolution obtained is not sufficient. With the system for laser plate making by use of a photopolymerizable printing plate as a plate material, the resolution and cost-effectiveness are high. However, the sensitivity is not sufficient, and a high power laser is required, thus making the system uneconomical.

For other direct plate making systems without use of laser, proposals have been made for methods employing a thermal drawing device such as a thermal head, and an ink drawing device. With the heat-sensitive plate making system, however, heat transmitted from the thermal head to a heat-sensitive recording surface is conveyed to a surrounding portion out of contact with the thermal head, thereby changing this portion. Thus, the boundary between image areas and non-image areas is not sharp, imposing limits on the resolution. The ink jet plate making system is free from this problem with the heat-sensitive plate making system, but involves increased complicacy, such as the need to select the most suitable ink depending on the type of the photosensitive resin on the plate material.

With textile printing or the like, a plate is usually used for a pattern portion, but a method of direct drawing onto a cloth by the ink jet method or the like has also been developed. In terms of productivity, however, the direct drawing method is inferior to a method which carries out textile printing after production of a plate. For mass production, the plate making method is still better.

As stated earlier, however, the conventional plate making method is high in cost, insufficient in the resolution and dimensional stability of the plate produced, complicated in procedure, or poor in mass producibility.

To make a plate with high resolution, ultraviolet rays are used to expose a photosensitive member. A portion of a film, where an image is drawn and ink is present, is required to have ultraviolet shielding properties as indispensable properties. Whereas a film portion, where no ink is present, must have ultraviolet transparency as an indispensable characteristic. The higher the contrast between these different properties, the better outcome will be obtained. Thus, it is necessary to combine an ink and a film which have such properties.

Ink jet recording method produces and flies ink droplets by various methods of ink ejection, such as electrostatic suction, a method of causing mechanical vibration or displacement to ink by the use of a piezoelectric element, and a method of heating ink to generate bubbles and push the ink under their pressure. By depositing the ink droplets onto a material to be recorded, ink jet recording makes records.

Ink used for ink jet recording is one consisting mainly of water because of safety and recording characteristics. Extensive studies on the ink have been conducted to prevent clogging of the nozzles and ensure the stability of ejection.

The material to be recorded, which is used for the ink jet recording method, is a transparent film which has been treated to acquire hydrophilicity. Water-soluble ink is ejected onto the so treated film to form an image pattern, thereby, for example, producing an OHP film. With the performance improvement and widespread use of ink jet recorders, more advanced properties are being demanded of materials to be recorded and of ink, and efforts to obtain a high resolution, high grade recorded image are continued.

DISCLOSURE OF THE INVENTION

It is an object of the present invention to provide a plate making film which is free from the drawbacks of the above-described earlier technologies, inexpensive, excellent in resolution, satisfactory in accuracy and dimensional stability, and good in mass producibility; and a plate making method and a plate making system which use the plate making film.

It is another object of the invention to provide a plate making ink giving a plate making film which is low in facility cost, convenient to use, free from excessive bleeding, and high in resolution and grade. The ink comprises a water-soluble dye, and forms an image pattern when ejected onto a transparent film as a material to be recorded in an ink jet printer, the transparent film having been treated to acquire hydrophilic properties.

The plate making film according to the present invention is characterized by having a transparent substrate, and a layer provided on the substrate, the layer consisting essentially of a polymeric compound composed of a repeating unit represented by the following general formula (1):

$$\text{\{AXAR}_1\text{\}}\tag{1}$$

wherein

A comprises and the mode of addition of A being x, y and z each denote an integer of 1 or more, the weight ratio calculated from x, y and z, i.e., 44(x+z)/(the molecular weight of an α-olefin oxide having 3 or more carbon atoms)y, ranges from 80/20 to 94/6, X is a residue of an organic compound having 2 active hydrogen groups, Y is a hydrocarbon group having 1 or more carbon atoms, and $R_1$ is a dicarboxylic acid compound residue or a diisocyanate compound residue.

If the above-mentioned weight ratio, i.e., 44(x+z)/(the molecular weight of an α-olefin oxide having 3 or more carbon atoms)y, is less than 80/20, the hydrophilicity declines, resulting in poor ink absorptivity and poor printability. If the weight ratio exceeds 94/6, on the other hand, the resulting film will be poor in terms of ink bleeding and water resistance. Y has the function of imparting hydrophobicity to the polymeric compound of the general formula (1). Preferred examples of Y are alkyl groups such as an ethyl group. By setting the proportions of x, y and z at those which satisfy the range defined above, the resulting film can become insoluble in water without losing hydrophilicity. Thus, the film of the present invention, unlike the transparent film in Japanese Patent Application Laying-open No. 6-47924 (1994), can prevent ink from spreading gradually after printing.

The plate making film desirably has light transmittance at 400 nm of 10 to 40%.

The plate making method according to the present invention is characterized by including the step of:

drawing an image on the surface of the layer consisting essentially of the polymeric compound of the aforementioned plate making film;

bringing the drawn plate making film into intimate contact with a photosensitive member;

exposing the photosensitive member through the plate making film; and stripping the plate making film from the photosensitive member, and developing the photosensitive member.

In this method, the drawing step is desirably performed by ink jet recording.

The plate making system according to the present invention is characterized by including ink jet drawing means for drawing a predetermined image on a surface of a transparent plastic film with an ultraviolet absorbing ink, the transparent plastic film being hydrophilic and ink absorptive at least on the surface; exposure means for exposing a photosensitive member to ultraviolet radiation by use of the drawn transparent plastic film as a photomask; and developing means for developing the exposed photosensitive member to prepare a printing plate.

Preferably, the transparent plastic film is the aforementioned plate making film having a transparent substrate, and a layer provided on the substrate, the layer essentially consisting of a polymeric compound composed of a repeating unit represented by the general formula (1).

The drawing means, exposure means, and developing means in the plate making system may be drawing means, exposure means, and developing means for production of a large image plane.

Both of a presensitized plate for offset printing, and a photosensitive resin plate for screen printing and flexography form an image, when intimately contacted with a plate making film, and irradiated with ultraviolet radiation from a high pressure mercury lamp, a metal halide lamp, a chemical lamp or the like. Thus, an image drawn on the plate making film, in other words, an ink for drawing the image, needs to cut 99.99% or more of ultraviolet radiation. In addition, the ink, as stated earlier, must be excellent in wetting properties for and absorbability to the plate making film, and free from stain due to escape of ink, excessive bleeding of a printed image plane under high humidity, and stickiness of the printed surface.

That is, the plate making ink according to the present invention is a plate making ink for use on a plate making film having a layer provided on a transparent substrate, the layer consisting essentially of a polymeric compound composed of a repeating unit represented by the aforesaid general formula (1), the ink being characterized by containing a water-soluble azo dye selected from mono- or disazo dyes, the azo dye being a yellow dye highly absorptive for light with a wavelength of 350 to 450 nm.

Preferably, the water-soluble azo dye contains an acetoacetic anilide bond. Further preferably, the aforementioned plate making film is a film for a presensitized plate for offset printing, or a film for making a plate for screen printing or flexography, and the aforesaid plate making ink is ink for direct drawing onto the plate making film by means of an ink jet printer.

The plate making ink is preferably such that D/T, the ratio of the diameter D and the depth T of a dot in an image printed on the plate making film described above by means of an ink jet printer using the plate making ink, i.e., D/T, is $1.1 < D/T < 8$.

The yellow dye may be contained in an amount of 1 to 10% by weight based on the total weight of the plate making ink.

Predetermined additives may be contained in an amount of 5 to 40% by weight based on the total weight of the plate making ink.

Ethanol may be contained in an amount of 3 to 12% by weight based on the total weight of the plate making ink.

The above and other objects, as well as the effects, features and advantages of the present invention will become clearer by reference to the Examples offered below and the accompanying drawings.

BEST MODE FOR CARRYING OUT THE INVENTION

The plate making film according to the present invention comprises a layer of a polymeric compound formed on a transparent substrate, especially a transparent plastic substrate, the polymeric compound being composed of a repeating unit represented by the aforementioned general formula (1). This polymeric compound can be formed by addition polymerizing ethylene oxide with ethylene glycol, followed by addition polymerization with an alkylene oxide, further followed by addition polymerization with ethylene oxide, and then reacting a dicarboxylic acid compound or derivatives thereof, or a diisocyanate compound with the resulting polyalkylene oxide.

The dicarboxylic acid compound is preferably a cyclic or linear dicarboxylic acid compound, and its derivatives include dicarboxylic acids, dicarboxylic acid anhydrides, and lower alkyl esters of dicarboxylic acids. Examples of the dicarboxylic acids include phthalic acid, isophthalic acid, terephthalic acid, malonic acid, succinic acid, sebacic acid, maleic acid, fumaric acid, adipic acid, and itaconic acid. As the dicarboxylic acid anhydrides, anhydrides of the dicarboxylic acids listed above are exemplified. Examples of the lower alkyl esters of the dicarboxylic acids are methyl ester, dimethyl ester, ethyl ester, diethyl ester, propyl ester, and dipropyl ester of the various dicarboxylic acids.

Particularly preferred are linear dicarboxylic acids having 12 to 36 carbon atoms, their anhydrides and their lower alkyl mono- and di-esters. Examples of the straight chain dicarboxylic acids having 12 to 36 carbon atoms are 1,10-decamethylenedicarboxylic acids, 1,14-tetradecamethylenedicarboxylic acids, 1,18-octadecamethylenedicarboxylic acids, and 1,32-dotriacontamethylenedicarboxylic acids. The lower alkyl esters include, for example, methyl ester, ethyl ester, propyl ester, and dipropyl ester of these dicarboxylic acids. These compounds can be used alone or in combination of two or more. From the aspect of the ease of reaction, it is preferred to use the dicarboxylic acid anhydrides, or the lower alkyl mono- or di-esters of the dicarboxylic acids.

Examples of the diisocyanate compounds are 4,4'-diphenylmethane diisocyanate, toluene diisocyanate, xylylene diisocyanate, isophorone diisocyanate, and methylenebiscyclohexyl diisocyanate (H12MDI). These compounds can be used alone or in combination of two or more.

The so obtained polymeric compound of the general formula (I) is coated onto a transparent plastic substrate, and may further be irradiated with ionizing radiation, such as ultraviolet rays or gamma rays, to crosslink the polymeric compound.

In the present invention, in order to obtain a plate making film which is inexpensive and satisfactory in accuracy and dimensional stability, there is used a special transparent plastic film preferred for drawing by the ink jet method. An ink jet drawing device can draw a high definition image by computer control.

In case of drawing by means of ink jets, for example, the drawn portion must have an absorption peak in the ultraviolet wavelength region to filter out ultraviolet radiation for use in exposure of the photosensitive member. The film to have the image drawn also needs to be transparent and pervious to ultraviolet radiation. That is, the portion where the drawn ink exists must be ultraviolet-shielding, while the portion where no ink exists must be ultraviolet-transparent. The higher the contrast between these properties, the better outcome will result. If the content of the ultraviolet-absorbing dye is high, the ultraviolet shielding property is expected to increase, thus enhancing the contrast. Actually, however, there are dissolution limits to the amount of the dye that can be contained in the ink. Hence, the content of the dye cannot be increased limitlessly. With ink for ink jet use which is very strict about nozzle clogging or the like, in particular, the content of the dye is usually only several percent.

In view of these facts, it is conceivable to impart ultraviolet shielding properties to the film itself. Although the ultraviolet shielding property of ink is overwhelmingly higher than the ultraviolet shielding property of the base film itself, the total ultraviolet shielding property of the ink and the film represents the shielding concentration of the image areas. To increase the ultraviolet shielding property of the image areas, therefore, the ultraviolet shielding property of the base film itself is increased. This is an industrially useful means. In other words, control of the ultraviolet transmission of the base film in a range in which plate making operation is practically not affected can achieve the required shielding concentration in the image areas.

In the present invention, the desirable light transmittance of the base film for light with a wavelength of 400 nm is 10 to 40%.

Methods of controlling the ultraviolet shielding property in a film are classified into a control method for internal haze by controlling the degree of crystallinity of the substrate or the recording material; and a control method for external haze by controlling surface roughness, for example. Either control method may be used for the present invention.

For drawing of an image on a film by the ink jet method, the film needs to be hydrophilic at least on its surface in consideration of the properties of ink. As a material meeting this requirement, a polyvinyl alcohol-based polymer film, or a cellulose-based polymer film is known. A polyethylene oxide type polymer film is also a unique substance which exhibits good hydrophilicity because of the ether groups in its molecular structure. Furthermore, since polyethylene oxide has thermoplasticity, it is thus characterized in that it can be mass produced by a dry process such as film extrusion.

Ink used for the ink jet method, on the other hand, is often one consisting essentially of a slow-drying water-miscible polyhydric alcohol, or its ether, intended for preventing nozzle clogging. When such ink is printed on a polyethylene oxide type polymer film, bleeding often occurs with the passage of time. Under these circumstances, the inventors of the present invention conducted extensive studies on film materials which may eliminate bleeding of ink while retaining excellent thermoplasticity and hydrophilicity. As a result, they have discovered the above-described material.

The plate making film of the present invention can prevent gradual spread of ink after printing, while retaining thermoplasticity and hydrophilicity, by appropriately incorporating hydrophobic groups into its molecular structure. Because of these characteristics, resolution and sharpness of image can be remarkably increased. After image drawing with ink, the image areas are coated with, for example, a transparent and hydrophobic resin, whereby water resistance and marring resistance can be improved.

The ink of the present invention is a plate making ink used preferably for the above-mentioned plate making film, which contains a water-soluble azo dye selected from mono- or disazo dyes, the azo dye being a yellow dye highly absorptive for light with a wavelength of 350 to 450 nm.

The yellow azo dye with a structure containing an acetoacetic anilide bond that is used in the present invention includes, for example, the following dyes:

(2)

This monoazo compound can be prepared by the following ordinary synthesis:

(3)

(4-morpholinobenzene-2,5-disulfonic acid disodium salt diazonium chloride+3-hydroxyacetoacetanilide)

(4)

This monoazo compound can be prepared by the following ordinary synthesis:

(5)

(4-morpholinobenzene-2,5-disulfonic acid disodium salt diazonium chloride+N-Benzyl acetoacetamide)

Also, (6)

which is known as C.I. Direct Yellow 8 (trade name), and (7)

which is known as C.I. Direct Yellow 27 (trade name) can be used as the azo dye according to the present invention.

The above-described coupling reaction forms a mixture of an ortho-isomer and a para-isomer. The ratio of the isomers can be adjusted by controlling pH.

The azo dyes used in the present invention are not limited to those stated above, and they may be used alone or as a mixture of two or more. Since the dye of the invention is a yellow dye, it is more desirable to concomitantly use a black dye in order to obtain reflection density (apparent density).

The amount of the dye added into the plate making ink is preferably 1 to 10% by weight, if the printing density and the clogging phenomenon are taken into consideration.

The plate making ink according to the present invention uses water as a main solvent component. For purposes, such as the adjustment of the ink properties to the desired values, the prevention of drying, and the improvement of dye solubility, it is more preferred to add the following additives.

The plate making ink according to the present invention can contain predetermined additives. The predetermined additives refer to various glycols and glycerin, etc. for prevention of drying, urea as a dye dissolution assistant, water soluble organic solvents such as Cellosolve (trade name of Union Carbide Inc. for ethylene glycol monoethers), and surface active agents for adjustment of surface tension, such as alcoholamine. The total amount of these additives may be in the range of 5 to 40% by weight. Ultraviolet absorbers, antifungal agents, etc. may also be used.

Figure 1:
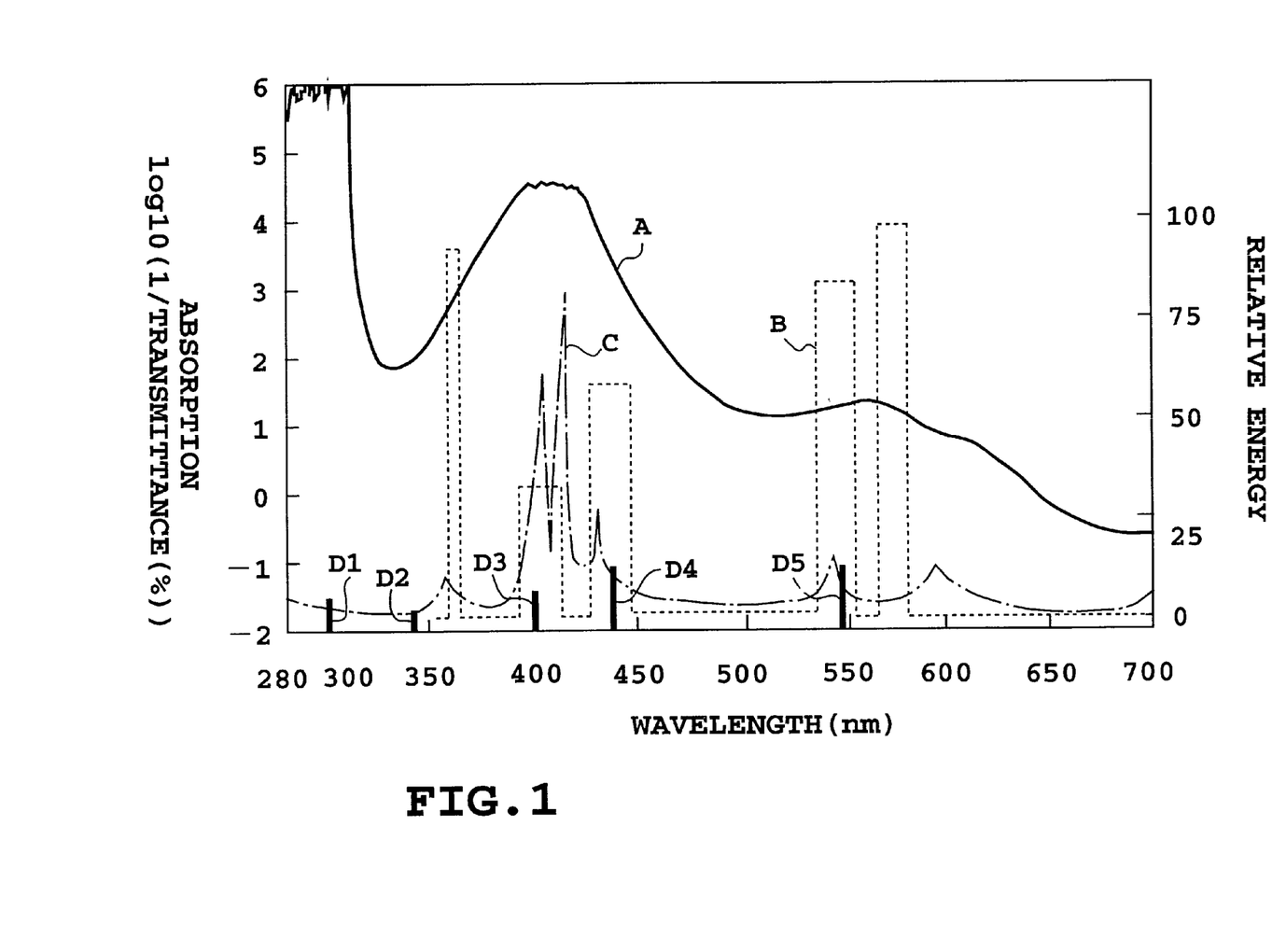
FIG. 1 shows the absorption spectrum of an embodiment of the ink according to the present invention, and the emission spectra of light sources.

In the present invention, moreover, ethanol is preferably contained in an amount of 3 to 12% by weight based on the weight of the entire ink. When ethanol is added within this range to the ink, bleeding of an image is moderate; namely, moderate spread of ink is obtained. Thus, the image density is also uniform, so that a very high grade image can be obtained. The "moderate spread" refers to the fact that a droplet of ink, while penetrating the ink receiving layer, rapidly enlarges its area of contact to a degree to which it does not excessively overlap other adjacent droplets. FIG. 1 shows the absorption spectrum of an embodiment of ink according to the present invention, and emission spectra of three types of light sources. The horizontal axis of FIG. 1 represents wavelengths (nm), while the vertical axis on the left side represents the absorption of ink expressed as the reciprocal of transmittance (%) graduated on a common logarithmic scale. For example, the absorption of 99.99% (transmittance 0.01%) gives the value 2 on the vertical axis. Graduations on the right side represent the relative values of energies corresponding to the emission wavelengths of the respective light sources. In FIG. 1, a solid line A indicates the absorption spectrum of ink; a dashed line B and a dot and half line C indicate the emission spectra of a mercury lamp and a metal halide lamp, respectively; and five discrete line spectra D1, D2, D3, D4 and D5 represent the emission spectra of a chemical lamp. As illustrated, the ink according to the present invention blocks most of light in the region of wavelengths from 350 nm to 450 nm, and allows passage of only up to several percent of light in the region from 500 nm to 700 nm, in response to light from the representative light sources. The absorption for the ultraviolet region is about 10,000 times as great as the absorption for the visible light region.

An ink jet recorder is usually designed such that adjacent dots on a recording medium contact each other, or slightly overlap. Assume that the dot density is 600 dots/inch. This dot density corresponds to about 23.6 dots/mm. Upon calculation, this means that with a dot diameter of about 40 $\mu$m, adjacent dots contact to each other. If a dot is approximated by a circle, an ink-free space is present inside four dots which are in contact. This generally does not matter, because dots are so small that the space inside the dots is also tiny. However, it may be preferred that dots overlap to some extent to give a high color density to a large-area portion to be filled in solidly. An example is a case in which a pattern to be recorded includes the large-area portion to be filled in solidly, and a network-patterned portion. Since the degree of overlapping of dots differs according to bleeding of ink, it is desirable that the bleeding of ink can be controlled.

An ink droplet ejected from a nozzle of a recording head collides with the surface of a recording medium, forming a dot. A nearly spherical ink droplet collapses, and the diameter of ink on the surface of the recording medium becomes larger than the diameter of the ink droplet ejected. Further, the ink is absorbed in the thickness direction of the recording medium, and also spreads in the facial direction of the recording medium, thereby causing bleeding.

Figure 2A:
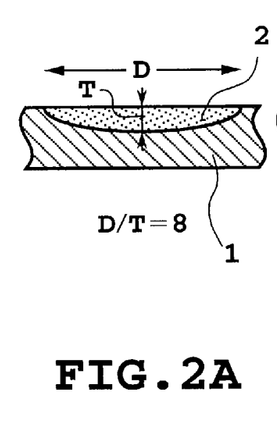
FIGS. 2A to 2E are schematic views showing the shape of a dot in a cross section of a recording medium, and the degree of bleeding of ink.
Figure 2B:
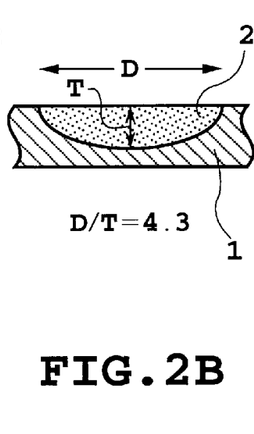
Figure 2C:
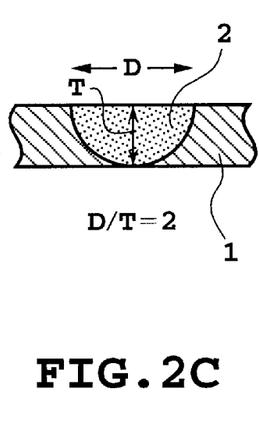
Figure 2D:
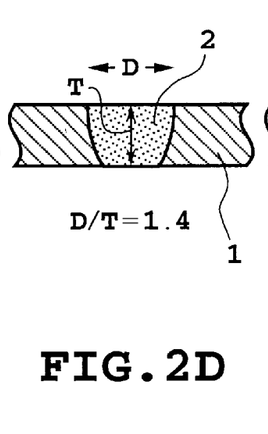
Figure 2E:
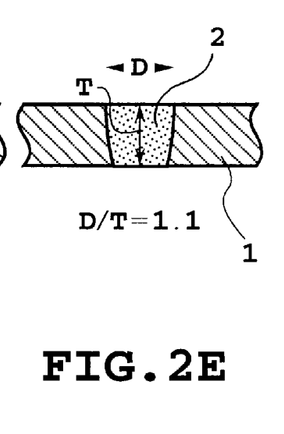

The degree of bleeding is affected by the thickness of the recording medium, as well as the physical properties of the ink and the recording medium, such as the wetting properties of water-soluble ink for the recording medium. The inventors have studied whether or not this degree of bleeding can be defined by a parameter not including the thickness of the recording medium so that the thickness of the recording medium does not matter. As a result, they have concluded that the degree of bleeding need not be defined by the thickness of the recording medium. They have found that the degree of bleeding can be relatively defined by the cross sectional shape of a dot of ink in the recording medium penetrated by the dot, namely, the ratio between the spread of ink on the surface of the recording medium and the depth of ink penetration in the thickness direction of the recording medium. FIGS. 2A to 2E are schematic views for explaining that the degree of bleeding can be relatively defined by the shape of a dot 2 in a cross section of a recording medium 1. In FIGS. 2A to 2E, the area of the cross section of the dot, i.e., the volume of ink forming the dot, is set at a nearly constant value. FIG. 2A shows the cross sectional shape of a dot in which the spread of ink is the greatest, and the depth of ink penetration is the smallest, with the ratio of the diameter D to the depth T of the dot, D/T, being 8. FIG. 2B shows the cross sectional shape of a dot with D/T=4.3, FIG. 2C shows that with D/T=2, FIG. 2D shows that with D/T=1.4, and FIG. 2E shows that with D/T=1.1. One will see that the larger the value of D/T, the greater the bleeding of ink, showing that the dot spreads more, making the degree of adjacent dots overlapping higher. The fact that the larger the value of D/T, the greater the bleeding of ink does not relate to the magnitude of the dot diameter of the design.

Figure 3A:
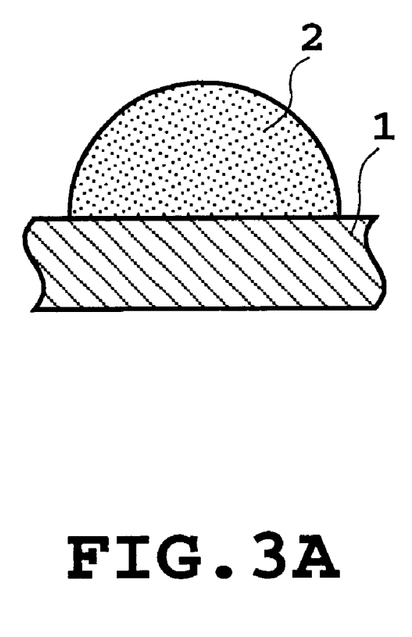
FIG. 3A is a view schematically showing the cross sectional shape of an ink droplet immediately after its arrival at a recording medium.
Figure 3B:
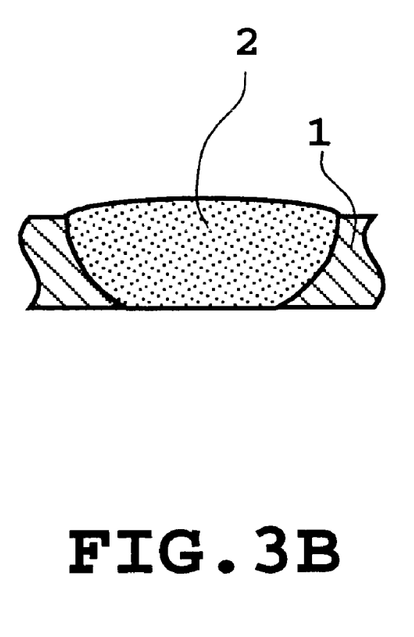
FIG. 3B is a view schematically showing the cross sectional shape of the ink droplet after a lapse of a certain time.
Figure 3C:
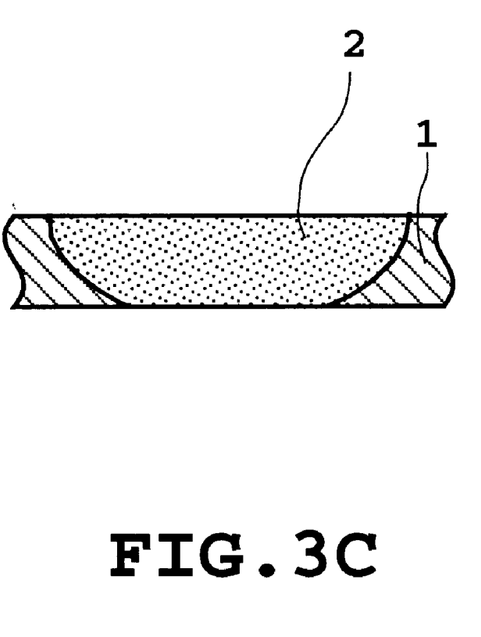
FIG. 3C is a view schematically showing the cross sectional shape of the ink droplet after drying of ink.
Figure 4A:
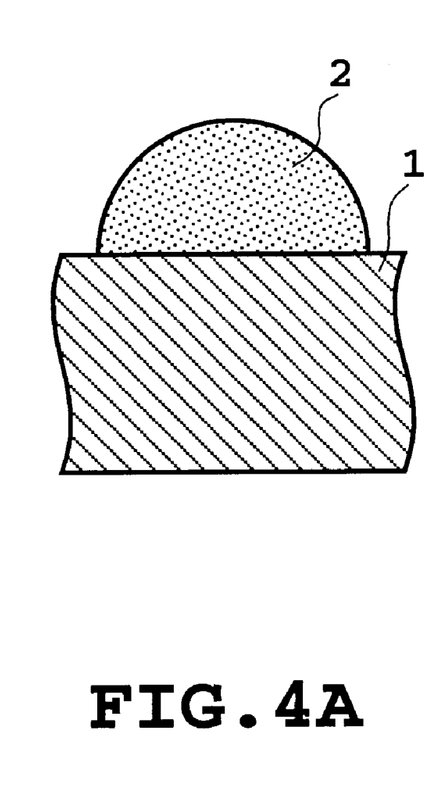
FIGS. 4A to 4C are views schematically showing the cross sectional shapes of an ink droplet which has arrived at a recording medium.
Figure 4B:
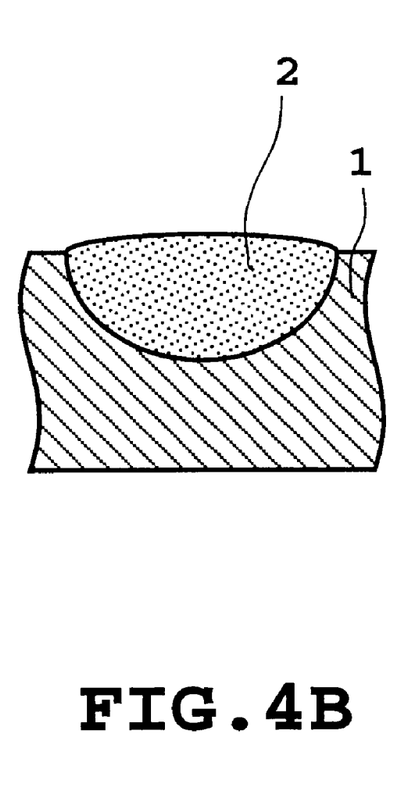
Figure 4C:
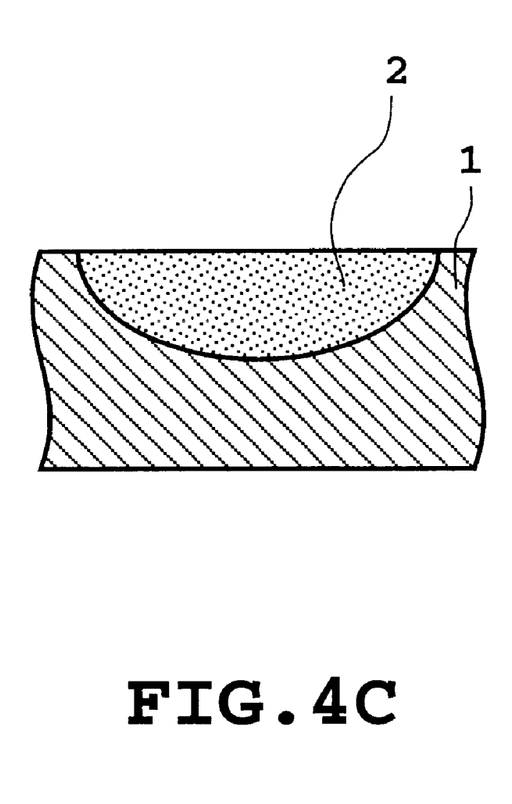

Next, the relation between the thickness of the recording medium and the degree of bleeding is investigated. FIGS. 3A to 3C and FIGS. 4A to 4C schematically show changes over time in the cross sectional shape of ink 2 on a recording medium 1 which is thin and thick, respectively. FIG. 3A and 4A show the cross sectional shape of an ink droplet immediately after its arrival at a recording medium. FIG. 3B and 4B show the cross sectional shape of the ink droplet after a lapse of a certain time, and FIG. 3C and 4C show the cross sectional shape of the ink droplet after drying of ink. As will be seen upon comparison between FIGS. 3A to 3C and FIGS. 4A to 4C, when the recording medium is thin, ink immediately penetrates the entire thickness of the medium. Thereafter, the ink spreads in the facial direction, increasing bleeding. When the recording medium is thick, ink is fully absorbed in the thickness direction of the medium, so that ink spread in the facial direction, i.e., bleeding, is slight. Here, the thickness of the recording medium being large or small means a mutual amount related to the size of the ink droplet or the dot density, and does not mean the absolute value of the thickness of the recording medium.

EXAMPLES

The present invention will be described in detail by reference to it embodiments.

Ethylene oxide was addition polymerized with ethylene glycol, and then butylene oxide was addition polymerized. Further, ethylene oxide was addition polymerized to obtain a polyalkylene oxide. To the polyalkylene oxide, a methyl octadecane-1,18-dicarboxylate was added to perform an ester exchange reaction. The resulting polymeric compound having a weight average molecular weight of 150,000 was melted in an extruder, and extruded to a thickness of 10 $\mu$m at a T die temperature of 140° C. The extrudate was coated onto a 100 $\mu$m thick polyethylene terephthalate film, and the coated film was irradiated with 10 Mrad $\gamma$ rays to produce a transparent plastic film as a plate making film.

The so obtained transparent plastic film was transparent to ultraviolet radiation, and its surface was hydrophilic and satisfactory in ink absorptivity.

Figure 5:
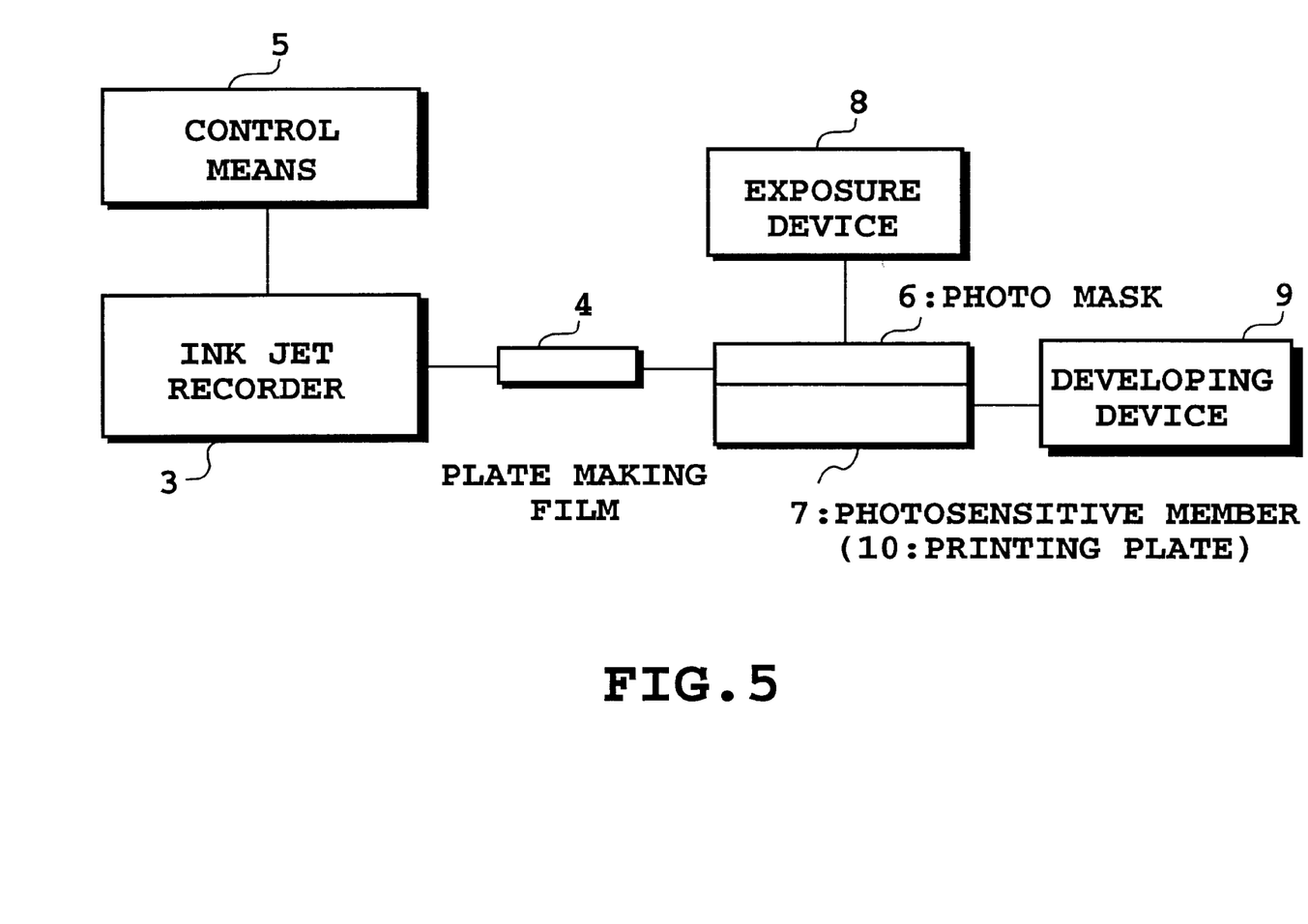
FIG. 5 is a block diagram of an embodiment of a plate making system according to the present invention.

FIG. 5 shows a block diagram of an embodiment of a plate making system using this plate making transparent plastic film.

An ink jet recorder 3 draws a predetermined image on a plate making transparent plastic film 4 by use of an ultraviolet absorbing ink. The ink jet recorder 3 is controlled by control means 5 which is preferably a computer. The image-drawn plate making transparent plastic film is used as a photomask 6 for plate making. That is, this photomask 6 is brought into intimate contact with a photosensitive member 7 having a photosensitive membrane on the surface. The photosensitive member 7 is exposed to ultraviolet radiation through the photomask 6 by an exposure device 8. Then, the photomask is peeled off, and subjected to treatments by a developing device 9, including washing with water, drying, and curing of the photosensitive membrane, to prepare a plate 10 for printing.

Concretely, an image constructed by, say, a computer was converted to data. Based on this data, an image was drawn on a transparent film by means of HP Design Jet 330 (an ink jet printer of Hewlett Packard). Ink used was water base ink Screen jet Emulsion Dye (Gerber) with high ultraviolet shielding properties and having an absorption peak at a wavelength of 370 to 420 $\mu$m.

The so image-drawn transparent plastic film was used as a photomask for production of a printing plate, and plate making was performed in the following manner:

Example 1

The above-described image-drawn transparent plastic film was intimately contacted, as an exposure mask, with APR Flex (a registered trade mark for a photosensitive polyurethane resin for letterpress printing; FB type; ASAHI CHEMICAL INDUSTRY CO., LTD.) to form a laminate. The image-drawn transparent plastic film includes a layer of a polymeric compound composed of a repeating unit represented by the general formula (1). The laminate was exposed by a metal halide lamp (6 kW) for 5 minutes, and then, the transparent plastic film was peeled off. Then, the exposed resin was washed with water for 3 minutes, and exposed again in water for 10 minutes. Further, the surface of the photosensitive resin was treated with a rinsing solution for 5 minutes by a publicly known method. The treated resin was dried for 5 minutes to obtain a resin letterpress with a plate thickness of 0.7 mm and a Shore hardness of about 60 degrees. Using this letterpress, flexography was successfully performed which was satisfactory for printing of a package and a corrugated board having resolution expressed as a line width of 100 to 150 $\mu$m.

Example 2

The above-described image-drawn transparent plastic film was intimately contacted with a presensitized plate (Fuji Photo Film Co., Ltd.). The presensitized plate was prepared by anodizing a grained aluminum plate, then pretreating the anodized plate with a zirconium fluoride salt, and coating the pretreated plate with a paradiazodiphenylamine-paraformaldehyde condensate to a thickness of 5 to 8 $\mu$m for photosensitization. The film-plate laminate was exposed by a metal halide lamp (3 kW) for 40 seconds, and then, the transparent plastic film was peeled off. Then, the plate was subjected to treatments by an automatic presensitized plate processor in a publicly known manner, including washing with water, reinforcing treatment of a membrane, and baking. Using the so treated plate, offset printing was performed. Favorable results were obtained with resolution expressed as a line width of 100 $\mu$m.

Example 3

A 100-mesh Tetron screen fabric was attached to an aluminum frame, and a diazo photosensitive emulsion Superking (a registered trade mark for a mixture of a PVA-vinyl acetate emulsion and a diazo compound; TOKYO OHKA KOGYO CO., LTD.) was coated thereon to a thickness of 30 μm by means of a bucket. Then, the coated fabric was dried in the dark, and the aforementioned image-drawn transparent plastic film was intimately contacted with the fabric. The film-fabric laminate was exposed by a metal halide lamp (3 kW) for 40 seconds, whereafter the transparent plastic film was peeled off. Then, washing with water, drying, and treatment in a hardening bath to obtain a silk screen plate. Using this silk screen plate, silk screen printing was successfully performed which was satisfactory for textile printing, and printing of a nameplate, a billboard, etc. having resolution expressed as a line width of 150 μm.

Example 4

A silk screen plate was obtained in the same manner as in Example 3, except that the size of the printing plate had a large image plane measuring 914 mm×2,000 mm. Using this silk screen plate, silk screen printing was successfully performed which was satisfactory for printing of a large image plane having resolution expressed as a line width of 150 μm, the large image plane being usable for advertising, such as outdoor one.

Example 5

Like the printing transparent plastic film used in Example 1, a transparent plastic film was prepared by extruding a film, which consisted essentially of a polymeric compound having a recurring unit of the general formula (1), to a thickness of 10 μm by means of an extruder, and coating the film onto a 100 μm thick polyethylene terephthalate film. However, four types of plate making films, A, B, C and D, were obtained by nipping the transparent plastic film by use of a touch roll, while controlling the temperature of the touch roll to 10° C., 25° C., 35° C. and 50° C. to vary the transparency of the recording material. The respective films were measured for the light transmittance for light with a wavelength of 400 nm. The light transmittances were found to be 58% for film A, 36% for film B, 15% for film C, and 1% for film D.

Then, screen printing was performed using the respective films by the method shown in Example 3. That is, the four films A, B, C and D were each image-drawn, and intimately contacted with a Tetron(trade name) screen fabric coated with a sensitizing agent to two thicknesses, 30 μm and 200 μm. The film-fabric laminate was exposed by a metal halide lamp for each of 15 seconds and 2 minutes to obtain screen printing plates. Using each of the resulting screen plates, screen printing was performed. The results are given in Table 1.

TABLE 1

| | | Screen plate printing | |
|---|---|---|---|
| | Transmittance of image area at 400 nm | 30 μm thick × 15 sec. exposure | 200 μm thick × 2 min. exposure |
| Film A | 0.11% | Good | Insufficient light shielding of image area |
| Film B | 0.008% | Good | Good |
| Film C | 0.0004% | Good | Good |

TABLE 1-continued

| | | Screen plate printing | |
|---|---|---|---|
| | Transmittance of image area at 400 nm | 30 μm thick × 15 sec. exposure | 200 μm thick × 2 min. exposure |
| Film D | 0.0002% | Insufficient transmission of non-image area | Good |

The results show that with the films B and C having light transmittance at 400 nm in the range of 10 to 40%, the contrast of the printed image was marked, and its resolution was excellent, when the coating thickness of the sensitizing agent was 30 μm and the exposure time was 15 seconds, or when the coating thickness of the sensitizing agent was 200 μm and the exposure time was 2 minutes. With the film A having light transmittance of more than 40%, the contrast was not sharp for the exposure time of 2 minutes, when the coating thickness was 200 μm. In this case, when the exposure time was limited, a satisfactory image could be obtained. With the film D having light transmittance of less than 10%, when the coating thickness of the sensitizing agent was 30 μm, the contrast was not sharp for the exposure time of 15 seconds, because the exposure of the non-image areas was insufficient. In this case, when the exposure time was lengthened, a satisfactory image could be obtained.

Example 6

On the same transparent film for plate production as the transparent plastic film used in Example 1, an image was drawn using an ultraviolet absorbing ink by means of an ink jet recorder. The water resistance and marring resistance of the resulting image were evaluated by the methods described below. The same evaluation was performed for the same image-drawn film which is further thin coated spraying its surface with a solution of an acrylic resin in an organic solvent.

Evaluation of Water Resistance

The resulting film was cut to a size of 1 cm×5 cm, and immersed in a vat, 23 cm wide (W), 28 cm long (L), and 3 cm high (H), filled with water to a depth of about 2 cm. After a certain period of time, the film was taken out, and the image density was visually observed. On the film, a 5 mm wide linear black image had been drawn. The results of the evaluation are given in Table 2.

TABLE 2

| | 1 min. | 2 min. | 5 min. | 10 min. |
|---|---|---|---|---|
| Film | ○ | Δ | × | × |
| After spraying | ○ | ○ | ○ | ○ |

○: No change in image density.
Δ: Ink began to flow slightly.
×: Ink completely flowed out.

Evaluation of Marring Resistance

The surface of the image recording layer of the resulting film was rubbed with a cotton cloth folded into a 1 cm×2 cm square. Then, the surface of the image recording layer was observed visually. A 5 mm wide linear black image had been drawn on the film, and a single rub gave a scratch on the surface. On the film having the thin coating formed on the surface by spraying, by contrast, 20 rubs made no scratch. These findings show that when an image is drawn on a plate making transparent film by ink jet printing, and the image areas are overcoated, the water resistance and marring resistance of the transparent film can be further improved.

Suitable for the overcoating formed on the surface is a transparent, hydrophobic resin such as the aforementioned acrylic resin, polyvinyl chloride, or polyethylene terephthalate. Since an overcoating may be formed before the complete drying of the ink, its thickness is preferably 5 μm or less, more preferably 2 μm or less. Various methods are available for the formation of the overcoating, including lamination, coating, and dipping, for example. If it is considered that the overcoating formation is performed after ink jet recording, the above-described spraying is more convenient.

Comparative Example 1

Image drawing on a conventional ink jet OHP film was carried out in the same manner as described above by means of the aforementioned plotter. Using this film as a photomask, plate making was performed by the same methods as described in Examples 1 to 3. None of the resulting printing plates gave clear images, and were usable as photomask films for printing plate making.

Embodiments of a plate making ink according to the present invention will be described by way of concrete composition examples. In the following description, % refers to % by weight.

Example 7

A solution comprising 79.95% of demineralized water and 5.0% of a dye of the aforementioned formula (2) was heated to 60 to 70° C. with stirring. Then, the solution was cooled to room temperature, and 15.0% of triethylene glycol, 0.05% of diethanolamine, and 0.001% of a surface active agent were mixed, followed by stirring the mixture. Then, the mixture was filtered under pressure through a membrane filter with a pore diameter of 0.8 μm to prepare an ink for ink jet recording.

Example 8

A solution comprising 85.95% of demineralized water and 4.0% of a dye of the aforementioned formula (4) was heated to 60 to 70° C. with stirring. Then, the solution was cooled to room temperature, and 10.0% of glycerin, 0.05% of triethanolamine, and 0.001% of a surface active agent were mixed, followed by stirring the mixture. Then, the mixture was filtered under pressure through a membrane filter with a pore diameter of 0.8 μm to prepare an ink for ink jet recording.

Example 9

A solution comprising 75.95% of demineralized water and 6.0% of a dye of the aforementioned formula (6) was heated to 60 to 70° C. with stirring. Then, the solution was cooled to room temperature, and 10.0% of triethylene glycol, 0.05% of diethanolamine, and 4.0% of methyl cellosolve were mixed, followed by stirring the mixture. Then, the mixture was filtered under pressure through a membrane filter with a pore diameter of 0.8 μm to prepare an ink for ink jet recording.

Example 10

A solution comprising 78.95% of demineralized water, 3.0% of a dye of the aforementioned formula (7), and 3% of a black dye C.I. Direct Black 32 (trade name) was heated to 60 to 70° C. with stirring. Then, the solution was cooled to room temperature, and 15.0% of triethylene glycol, 0.05% of diethanolamine, and 0.001% of a surface active agent were mixed, followed by stirring the mixture. Then, the mixture was filtered under pressure through a membrane filter with a pore diameter of 0.8 μm to prepare an ink for ink jet recording.

Comparative Example 2

A plate making ink was prepared in the same manner as in Example 7, except that 6% of a black dye C.I. Direct Black 32 (trade name) was used in place of 5.0% of a dye of the formula (2) in Example 7.

Using each of the plate making inks of Examples 7 to 10 and Comparative Example 2, an image was drawn on a plate making film by means of an ink jet printer Design Jet 330 (Hewlett Packard), the plate making film having a layer consisting essentially of a polymeric compound composed of a repeating unit represented by the aforementioned general formula (1).

Then, the transmission density (translucency) of the image was measured for a wavelength of 400 nm by the use of an ultrahigh sensitivity spectrophotometer (Bunko Keiki Kabushiki Kaisha). The results are given in Table 3.

TABLE 3

|  | Transmission density | (Translucency %) |
| --- | --- | --- |
| Ex. 7 | 3.7 | $2.5 \times 10^{-4}$ |
| Ex. 8 | 3.5 | $3.2 \times 10^{-4}$ |
| Ex. 9 | 3.4 | $4.0 \times 10^{-4}$ |
| Ex. 10 | 3.3 | $5.0 \times 10^{-4}$ |
| Comparative Ex. 2 | 1.4 | $4.0 \times 10^{-2}$ |

As noted above, the plate making inks of the present invention all gave transmission density of more than 2, the value required of a masking film for printing plate making. The plate making ink of the comparative example gave transmission density as low as 1.4, and was insufficient in terms of the contrast to the printed image. As a result, this ink did not give a masking film which would obtain a clear image. For Examples 7 to 10, bleeding of the ink was evaluated by visual inspection. Ink bleeding was neither excessively great nor excessively slight, and images were satisfactory.

A plate making film, which had a layer consisting essentially of a polymeric compound composed of a repeating unit represented by the general formula (1) and on which an image was formed by using each of the plate making inks of Examples 7 to 10, was intimately contacted with a presensitized plate (Fuji Photo Film Co., Ltd.). The presensitized plate was prepared by anodizing a grained aluminum plate, followed by pretreating the anodized plate with a zirconium fluoride salt, and coating the pretreated plate with a paradiazodiphenylamine-paraformaldehyde condensate to a thickness of 5 to 8 μm for photosensitization. The film-plate laminate was exposed by a metal halide lamp (3 kW) for 40 seconds, and the plate making film was peeled off. Then, the plate was subjected to treatments by an automatic presensitized plate processor in a publicly known manner, including washing with water, reinforcing treatment of a membrane, and baking. Using the so treated plate, offset printing was performed. Favorable results were obtained with resolution expressed as a line width of 100 μm.

A similar plate making film having an image formed thereon by use of the ink shown in Comparative Example 2 was prepared, and plate making was performed in the same manner as described above. None of the resulting printing plates were able to obtain clear images, because the plate making film was insufficient in ultraviolet shielding properties.

Example 11

On the surface of the same presensitized plate as used in the above-mentioned Example, an image was directly drawn by means of an ink jet printer, Design Jet 330 (Hewlett Packard), using each of the plate making inks shown in Examples 7 to 10. Then, the image-drawn plate was exposed by a metal halide lamp (3 kW) for 40 seconds, and subjected to the same treatments as described above to prepare a printing plate. Using the printing plate, offset printing was performed. Favorable results were obtained with resolution expressed as a line width of 100 µm.

Example 12

Figure 6:
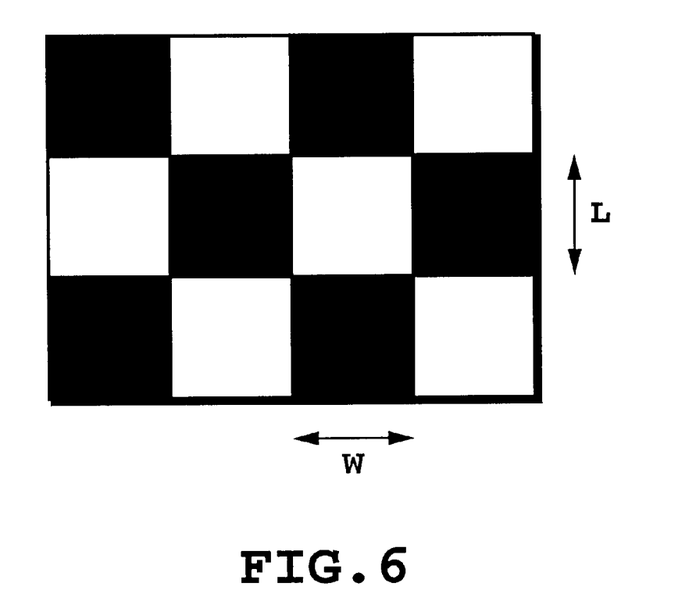
FIG. 6 is a view showing a checkered drawing of 16 dots square.

An image of a checkered pattern 16 dots square was drawn using the ink of Example 7, as shown in FIG. 6. The solid areas of the resulting checkered pattern were visually observed for the state of bleeding. The width (W) and the length (L) of each solid area were measured. The results are shown in Table 4.

TABLE 4

| Thickness of ink receiving layer (µm) | L (µm) | W (µm) |
|---|---|---|
| 10 | 790 | 790 |
| 20 | 640 | 610 |

Drawing using the ink of the present invention was found to obtain an image with a satisfactory checkered pattern and with moderate bleeding of the solid areas. The ink receiving layer refers to a layer consisting essentially of a polymeric compound composed of a repeating unit represented by the general formula (1).

Example 13

Figure 7A:
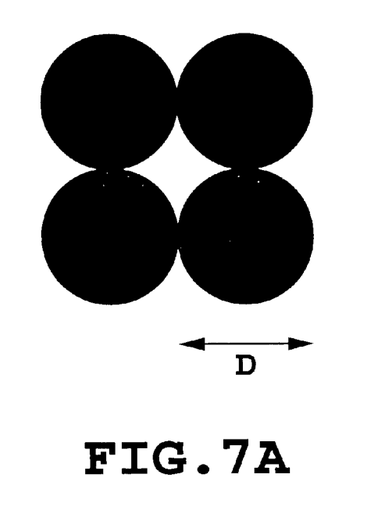
FIG. 7A is a top view showing the state of facial spread of ink onto a recording medium.
Figure 7B:
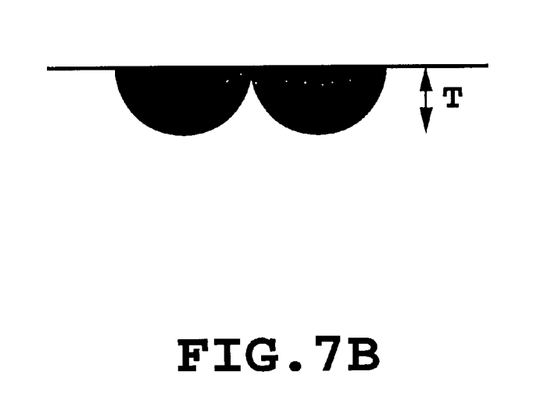
FIG. 7B is a sectional view showing the state of penetration of ink into a recording medium in its thickness direction.

Dots of ink containing 3% by weight of ethanol added to the ink of Example 7 were observed for bleeding in case of the ink receiving layer being 10, 20 and 30 µm thick. The diameter (D) and depth (T) of each of dots shown in FIGS. 7A and 7B were measured. The results are given in Table 5.

TABLE 5

| Thickness of ink receiving layer | Diameter of dot (D) | Depth of dot (T) | D/T |
|---|---|---|---|
| 10 µm | 59 µm | 10 µm | 5.9 |
| 20 µm | 53 µm | 12 µm | 4.4 |
| 30 µm | 53 µm | 12 µm | 4.4 |

Table 5 shows that the ink used in this Example gave the ratio of the diameter to the depth of the dot (D/T) being in the range of about 4 to 6, meaning that bleeding evaluated by visual inspection was moderate. The same evaluation was performed for the range of D/T other than 4 to 6, i.e., a range of greater than 1.1 but less than 8. Similar results were obtained for this range.

Next, the diameter (D) of the dot was measured, with the amount of ethanol added to the ink being varied in the following manner: 3%, 4.5%, and 6%. The results are given in Table 6.

TABLE 6

| Thickness of ink receiving layer | Amount of Ethanol added | | |
|---|---|---|---|
| | 3% | 4.5% | 6% |
| 10 µm | 59 µm | 62 µm | 82 µm |
| 20 µm | 53 µm | 59 µm | 74 µm |
| 30 µm | 53 µm | 59 µm | 74 µm |

An image of a checkered pattern 16 dots square was also drawn using each of the above-mentioned inks. Bleeding of the solid areas, and the uniformity of the image were visually evaluated. The results showed that when ethanol was added to the ink of the present invention, moderate spread of the ink was achieved, and dots of the solid areas fully overlapped to deepen the color density. Thus, the resulting image was sharp and uniform.

As described above, the present invention employs a plate making mask having on a transparent substrate a layer consisting essentially of a polymeric compound composed of a repeating unit represented by the aforementioned general formula (1). Thus, a printing plate can be achieved which can be preferably used for various types of printing, such as flexography, offset printing, silk screen printing, or the like. The use of the printing plate can lead to inexpensive printing of high resolution.

The present invention also enables a masking film for printing plate making to be formed by means of an ink jet printer. Thus, the invention can provide a low cost, simple, rapid block copy preparation step. The invention also makes it possible to carry out direct plate making without using a masking film.

The present invention has been described in detail by reference to the preferred embodiments, but includes changes and modifications made within the scope of the invention.

What is claimed is:

1. A plate making method, the method comprising;
   a) drawing an image on a surface layer of a plate making film, the plate making film including said surface layer and a transparent substrate, said surface layer comprising a polymeric compound that includes recurring monomeric units of the general formula;

[-AXAR$_1$-]

wherein
   A is;

(—CH$_2$CH$_2$O—)

and such that the mode of addition of A produces a polymer of the general formula;

wherein x, y and z each denote an integer of 1 or more and x, y and z have a weight ratio calculated from 44(x+z)/72y that ranges from 80/20 to 94/6,
   X is a residue of ethylene glycol, and
   R$_1$ is a dicarboxylic acid compound residue, or a diisocyanate compound residue,
   b) bringing the drawn plate making film into intimate contact with a photosensitive member;

c) exposing the photosensitive member through the plate making film;

d) stripping the plate making film from the photosensitive member; and e) developing the photosensitive member.

2. The plate making method of claim 1, wherein the drawing step is performed by ink jet recording.

3. The plate making method of claim 1, wherein said plate making film is made by melt-extrusion.

4. The plate making method of claims 1, wherein said plate making film has a light transmittance at 400 nm of about 10 to about 40%.

* * * * *